United States Patent
Suzuki et al.

(10) Patent No.: US 7,432,037 B2
(45) Date of Patent: Oct. 7, 2008

(54) CURABLE RESIN COMPOSITION AND FLEXOGRAPHIC PLATE MATERIAL USING THE SAME

(75) Inventors: Kenji Suzuki, Ibaraki (JP); Kenji Shachi, Ibaraki (JP); Mizuho Maeda, Ibaraki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 271 days.

(21) Appl. No.: 10/532,244

(22) PCT Filed: Oct. 20, 2003

(86) PCT No.: PCT/JP03/13377

§ 371 (c)(1),
(2), (4) Date: Apr. 22, 2005

(87) PCT Pub. No.: WO2004/038503

PCT Pub. Date: May 6, 2004

(65) Prior Publication Data

US 2006/0167168 A1   Jul. 27, 2006

(30) Foreign Application Priority Data

Oct. 23, 2002   (JP) .............................. 2002-308620

(51) Int. Cl.
  *G03F 7/031*   (2006.01)
  *C08J 3/28*    (2006.01)
  *C08F 297/04*  (2006.01)

(52) U.S. Cl. ................. 430/286.1; 430/287.1; 430/916; 522/114; 522/120; 522/125; 525/98; 525/193

(58) Field of Classification Search .................. 525/98, 525/193; 522/120, 125, 114; 430/286.1, 430/287.1, 916
See application file for complete search history.

(56) References Cited

U.S. PATENT DOCUMENTS

| | | | |
|---|---|---|---|
| 4,230,836 A | 10/1980 | Canterino | |
| 4,323,636 A | 4/1982 | Chen | |
| 5,250,389 A * | 10/1993 | Nakamura et al. | 430/281.1 |
| 5,496,684 A | 3/1996 | Farber et al. | |
| 6,326,127 B1 | 12/2001 | Morren et al. | |
| 2002/0045129 A1 | 4/2002 | Sugiyama et al. | |
| 2004/0132907 A1 | 7/2004 | Nakamura et al. | |

FOREIGN PATENT DOCUMENTS

| | | |
|---|---|---|
| EP | 0 013 139 A1 | 7/1980 |
| EP | 0 525 206 A1 | 2/1993 |
| EP | 0 859 284 A1 | 8/1998 |
| JP | 51-43374 | 11/1976 |
| JP | 55-34415 | 9/1980 |
| JP | 59-58015 | 4/1984 |
| JP | 02-108632 | 4/1990 |
| JP | 05-134410 | 5/1993 |
| JP | 2000-155418 | 6/2000 |
| JP | 2002-268228 | 9/2002 |
| WO | WO 00/00546 | 1/2000 |
| WO | WO 01/90818 A1 | 11/2001 |

OTHER PUBLICATIONS

Kiyoshi Akamatsu: "Kankosei jushi no kiso to jituyo (Basic and applications of photosensitive resins)" CMC Co., Ltd. pp. 152-160, 2001.
U.S. Appl. No. 10/531,990, filed Apr. 20, 2005, Suzuki, et al.
U.S. Appl. No. 10/532,244, filed Apr. 22, 2005, Suzuki, et al.
N.A. Weir, "Photolysis of Poly(p-Methylstyrene)", Journal of Applied Polymer Science, vol. 17, 1973, pp. 401-419.

* cited by examiner

*Primary Examiner*—Fred M Teskin
(74) *Attorney, Agent, or Firm*—Oblon, Spivak, McClelland, Maier & Neustadt, P.C.

(57) ABSTRACT

The invention provides a curable resin composition having an addition polymerization-based block copolymer (I) and an ethylenic unsaturated compound (II). Also provided is a flexographic plate material using the curable resin composition as its constituent. The flexographic plate material containing the curable resin composition of the present invention, can be cured to form strong and extendable areas and can be used to make flexographic plates that can form a sharp image plate surface even for a fine image. The flexographic plate material of the present invention is particularly useful in printing on cardboards, recycled paper or other paper articles with rough surfaces.

5 Claims, No Drawings

US 7,432,037 B2

CURABLE RESIN COMPOSITION AND FLEXOGRAPHIC PLATE MATERIAL USING THE SAME

TECHNICAL FIELD

The present invention relates to a curable resin composition and a flexographic plate material that contains the curable resin composition as its constituent. Containing the curable resin composition as its constituent, the flexographic plate material of the present invention is highly strong and extendable in the cured area and can thus be used to make flexographic plates that can form a sharp image plate surface even for a fine image. The flexographic plate material of the present invention is particularly suitable for printing on cardboard, recycled paper, or other materials having a rough surface.

BACKGROUND ART

A flexographic plate is a type of relief printing plates and generally includes an elastic relief plate made of rubber or photosensitive resin, to which a liquid ink is applied for printing. Flexographic plates can print on rough or curved surfaces and are thus widely used for printing images on wrapping, magazines, cardboards, labels, and bottles. Flexographic plates were previously manufactured by pouring molten rubber in a mold and then curing the rubber or by manually carving a rubber plate. Neither of these techniques was suitable for producing accurate flexographic plates, however. Lately, the development of a new technique that uses curable resins to make flexographic plate materials has made the production of flexographic plates considerably simple.

A typical flexographic plate material of the newly developed type includes, from top to bottom, a surface protective layer; a layer of a curable resin composition that is curable by irradiating with an active energy ray and is composed of an elastomer, such as urethane rubber, butyl rubber, silicon rubber and ethylene propylene rubber, an ethylenic unsaturated compound and, if necessary, a photopolymerization initiator; an adhesive layer; and a substrate (See, for example, "Kankosei jushi no kiso to jitsuyo (Basics and applications of photosensitive resins)" Supervised by Kiyoshi Akamatsu, CMC Co. Ltd. (2001) 152-160).

In one process for producing a flexographic plate from such a flexographic plate material, a film carrying a negative image of a letter, diagram, picture, pattern, or any other image to be printed is first applied to the surface of the protective film opposite to the substrate. The negative film is then irradiated with an active energy ray from above, so that the predetermined areas of the curable resin composition layer are selectively cured by the action of the active energy ray transmitted through the imaged area of the film and become insoluble to solvent. Subsequently, the negative film and the protective film are removed and a solvent is applied to remove the non-irradiated or uncured areas of the curable resin composition layer (development step) and thereby form an image area (i.e., image plate surface). This completes a flexographic plate (See, for example, "Kankosei jushi no kiso to jitsuyo (Basics and applications of photosensitive resins)" Supervised by Kiyoshi Akamatsu, CMC Co. Ltd. (2001) 152-160; Japanese Patent Publication No. S55-34415; U.S. Pat. No. 4,323,636; Japanese Patent Publication No. S51-43374; and Japanese Patent Application Laid-Open No. H2-108632).

In an effort to ensure formation of fine dots and lines on the flexographic plates and prevent chipping of the image plate surface during development, improvements have been made as to the type and proportion of the resin to be added to the curable resin composition. One example involves the use of a styrene-based block copolymer in which the part of the copolymer formed of a conjugated diene has a significant bound vinyl content (See, Japanese Patent Application Laid-Open No. H5-134410). In another example, a certain thermoplastic elastomer composed of a monovinyl-substituted aromatic hydrocarbon and a conjugated diene is used in conjunction with a diene-based liquid rubber that has a high average proportion of bound vinyl units (See, Japanese Patent Application Laid-Open No. 2000-155418).

The technique described in Japanese Patent Publication No. S55-34415 employs crystalline 1,2-polybutadiene in conjunction with a polymer compound, such as polyisoprene rubber, that comprises as its constituents at least one of ethylene, butadiene and isoprene. A drawback of this technique is that the uncrosslinked rubber used in the resin makes the flexographic plate susceptible to deformation (cold flow) during storage or transportation of uncured plates. U.S. Pat. No. 4,323,636 and Japanese Patent Publication No. S51-43374 describes the use of a certain block copolymer (preferably a styrene-isoprene-styrene triblock copolymer or a styrene-butadiene-styrene triblock copolymer having a particular composition) that is a thermoplastic elastomer and in which the hard segments have a grass transition temperature of 25° C. or above. In these techniques, the part of the copolymer formed of polystyrene causes a cohesive force, which reduces deformation of uncured plates. However, the polystyrene blocks of the elastomer do not undergo crosslinking even when irradiated with an active energy ray, so that the uncrosslinked polystyrene blocks causes a poor solvent resistance of the cured area. Consequently, the image area tends to swell when a solvent is applied to remove the uncured area, resulting in insufficient reproducibility and poor ink resistance of the flexographic plates. Another flaw of this technique is that the strength and extension of the cured area are insufficient especially for forming a fine image area and the resulting flexographic plate becomes less durable. This causes chipping in the edge of the image plate surface during the removal of the uncured area by washing with a solvent and, when necessary, a brush. As a result, the desired sharp image plate surface may not be obtained.

In the technique described in Japanese Patent Laid-Open Publication No. H2-108632, the flexibility of flexographic plates is increased by the use of a binder (preferably, a styrene-butadiene-styrene triblock copolymer) containing thermoplastic and elastomeric domains, in combination with a particular addition polymerizable ethylenic unsaturated monomer. Despite its improved flexibility, the resin according to this technique includes some part formed of a polystyrene block similar to the one described above, which makes the flexographic plate less resistant to solvent. The cured area of the flexographic plate obtained by this technique is not strong enough to form a fine image area.

Although both of the techniques described in Japanese Patent Application Laid-Open No. H5-134410 and No. 2000-155418 have managed to improve the curability of the part of the styrene-based thermoplastic elastomer formed of conjugated diene units and have managed to increase the toughness of the resulting flexographic plate, the similar polystyrene block part present in the thermoplastic elastomers suppresses the solvent resistance and the flexographic plates are not operative enough to form a fine image area.

Accordingly, it is an object of the present invention to provide a curable resin composition suitable for the production of a flexographic plate material that allows printing on an article with rough surfaces, such as cardboard and recycled paper. The curable composition of the present invention can be cured to form strong and extendable areas and can thus be used to make flexographic plates that can form a sharp image plate surface even for a fine image. It is also an objective of the present invention to provide a flexographic plate material that uses the curable resin composition as its constituent.

DISCLOSURE OF THE INVENTION

The present invention achieves this object by providing the following compositions or material:

<1> A curable resin composition, containing an addition polymerization-based block copolymer (I) and an ethylenic unsaturated compound (II), wherein:

the addition polymerization-based block copolymer (I) is selected from block copolymers comprising at least one polymer block A and at least one polymer block B, and the hydrogenated products thereof;

the polymer block A essentially comprises an aromatic vinyl compound unit containing at least 1% by mass of an alkylstyrene-derived structural unit (a) (which may be referred to simply as "structural unit (a)," hereinafter) in which at least one alkyl group having 1 to 8 carbon atoms is bound to a benzene ring; the polymer block B essentially comprises a conjugated diene compound unit; and at least the moiety of polymer block A can undergo crosslinking upon exposure to an active energy ray.

<2> The curable resin composition according to <1> above, further containing a photopolymerization initiator (III).

<3> The curable resin composition according to <1> or <2> above, further containing a softener (IV).

<4> The curable resin composition according to any one of <1> to <3> above, wherein the structural unit (a) is a p-methylstyrene unit.

<5> A flexographic plate material, using the curable resin composition according to any one of <1> to <4> above.

BEST MODE FOR CARRYING OUT THE INVENTION

The present invention will now be described in further detail.

The addition polymerization-based block copolymer (I), the essential component of the curable resin composition of the present invention, is selected from block copolymers comprising at least one polymer block A and at least one polymer block B, and the hydrogenated products thereof. The polymer block A essentially comprises an aromatic vinyl compound unit that contains at least 1% by mass of an alkylstyrene-derived structural unit (a) in which at least one alkyl group having 1 to 8 carbon atoms is bound to a benzene ring. The polymer block B essentially comprises a conjugated diene compound unit. At least the moiety of polymer block A can undergo crosslinking upon exposure to an active energy ray.

Examples of alkylstyrenes for forming the structural unit (a) of the polymer block A include o-alkylstyrene, m-alkylstyrene, p-alkylstyrene, 2,4-dialkylstyrene, 3,5-dialkylstyrene, and 2,4,6-trialkylstyrene with their alkyl groups having 1 to 8 carbon atoms, and halogenated alkylstyrenes in which one or more of the hydrogen atoms borne by the alkyl groups of the alkylstyrenes have been substituted with halogen atoms. Specific examples of the alkylstyrenes for forming the structural unit (a) include o-methylstyrene, m-methylstyrene, p-methylstyrene, 2,4-dimethylstyrene, 3,5-dimethylstyrene, 2,4,6-trimethylstyrene, o-ethylstyrene, m-ethylstyrene, p-ethylstyrene, 2,4-diethylstyrene, 3,5-diethylstyrene, 2,4,6-triethylstyrene, o-propylstyrene, m-propylstyrene, p-propylstyrene, 2,4-dipropylstyrene, 3,5-dipropylstyrene, 2,4,6-tripropylstyrene, 2-methyl-4-ethylstyrene, 3-methyl-5-ethylstyrene, o-chloromethylstyrene, m-chloromethylstyrene, p-chloromethylstyrene, 2,4-bis(chloromethyl)styrene, 3,5-bis(chloromethyl)styrene, 2,4,6-tri(chloromethyl)styrene, o-dichloromethylstyrene, m-dichloromethylstyrene, and p-dichloromethylstyrene.

The polymer block A may contain one or more units of the above-described alkylstyrenes and halogenated alkylstyrenes for forming the structural unit (a). Of these, p-methylstyrene unit, which can readily undergo crosslinking and is readily available, is particularly preferred as the structural unit (a).

The polymer block A contains aromatic vinyl compound units other than those forming the structural unit (a). Examples of such structural units include those formed of styrene, α-methylstyrene, β-methylstyrene, monofluorostyrene, difluorostyrene, monochlorostyrene, dichlorostyrene, methoxystyrene, vinylnaphthalene, vinylanthracene, indene, and acetonaphthylene. Of these, styrene and α-methylstyrene are particularly preferred.

The polymer block A of the addition polymerization-based block copolymer (I) forms hard segments. The alkyl groups, which are each bound to a benzene ring to form the structural unit (a), serve to introduce cross linkages in the hard segments of the polymer block A as they undergo the static crosslinking reaction upon exposure to an active energy ray.

The proportion of the structural unit (a) in the polymer block A is 1% by mass or more, preferably 10% by mass or more, and more preferably 40% by mass or more with respect to the mass of the polymer block A. The polymer block A may be made entirely of the structural unit (a). If the proportion of the structural unit (a) is less than 1% by mass, then the cross linkages are hardly introduced into the polymer block A, resulting in insufficient curability of the resulting curable resin composition. In the polymer block A, the structural unit (a) and other aromatic vinyl compound units may be linked to one another either randomly, in blocks or in tapered blocks.

Preferably, the polymer block A is present in the addition polymerization-based block copolymer (I) in an amount of 10 to 40% by mass. If the amount of the polymer block A is less than 10% by mass, then the ability of the polymer block A to physically aggregate to form the hard segments of the addition polymerization-based block copolymer (I) becomes weak. As a result, the uncured plate (i.e., flexographic plate material yet to be irradiated with an active energy ray) formed of the curable resin composition containing the addition polymerization-based block copolymer (I) becomes susceptible to cold flow. This causes significant deformation of the plate during storage or transportation, making the flexographic plate less suitable for printing. If the amount of the polymer block A is greater than 40% by mass, then the rubber elasticity of the curable resin composition is decreased, making it difficult for the flexographic plate to effectively transfer an ink to cardboards, recycled paper, and other paper articles that have rough surfaces.

When necessary, the polymer block A of the addition polymerization-based block copolymer (I) may include, along with the structural unit composed of the aromatic vinyl compound containing the structural unit (a), a small amount of structural units composed of other polymerizable monomers. The proportion of the structural unit composed of such other polymerizable monomers is preferably 30% by mass or less, and more preferably 10% by mass or less based on the mass of the polymer block A (or the total mass of the polymer blocks A when the addition polymerization-based copolymer (I) contains two or more polymer blocks A). Examples of the other polymerizable monomers include 1-butene, pentene, hexene, butadiene, isoprene, and methyl vinyl ether.

Aside from the polymer block A composed of the aromatic vinyl compound unit containing the structural unit (a), the addition polymerization-based block copolymer (I) for use in the present invention may contain a polymer block composed of an aromatic vinyl compound that does not contain the structural unit (a).

The polymer block B of the addition polymerization-based copolymer (I) is composed essentially of a conjugated diene compound unit. Examples of the conjugated diene compounds include butadiene, isoprene, 2,3-dimethyl-1,3-butadiene, 1,3-pentadiene, and 1,3-hexadiene. The polymer block B may be composed solely of one of these conjugated diene compounds, or it may be composed of two or more of the conjugated diene compounds. The polymer block B is preferably composed of butadiene, isoprene, or a mixture of butadiene and isoprene. While the type and the amount of the microscopic structure for forming the polymer block B are not limited to a particular type and amount, preferably 5 to 90 mol %, more preferably, 20 to 70 mol % of the monomer units of the polymer block B are linked by 1,2-linkage when the polymer block B is composed of, for example, butadiene units alone and when the polymer block B is composed of isoprene units alone or combination of butadiene units and isoprene units, 5 to 80 mol %, preferably 10 to 60 mol % of the monomer units are linked by 1,2-linkage or 3,4-linkage. When two or more conjugated dienes are used, the monomer units may be linked to one another either randomly, in blocks, in tapered blocks, or by two or more of these manners of linking.

When necessary, the polymer block B may contain, along with the structural units composed of the conjugated diene compounds, a small proportion of structural units composed of other polymerizable monomers. The proportion of such other polymerizable monomers is preferably 30% by mass or less and, more preferably, 10% by mass or less based on the mass of the polymer block B that forms the addition polymerization-based block copolymer (1) (or the total mass of the polymer blocks B when the addition polymerization-based copolymer (I) contains two or more polymer blocks B). Examples of the other polymerizable monomers include styrene, α-methylstyrene, and the aforementioned alkylstyrenes for forming the structural unit (a) (preferably, p-methylstyrene).

It is particularly preferred that the polymer block B be one of the followings: a polyisoprene block composed of isoprene units or a hydrogenated polyisoprene block in which some or all of the carbon-carbon double bonds originating from the isoprene units have been hydrogenated; a polybutadiene block composed of butadiene units or a hydrogenated polybutadiene block in which some or all of the carbon-carbon double bonds originating from the butadiene units have been hydrogenated; or a copolymer block composed of isoprene units and butadiene units or a hydrogenated copolymer block in which some or all of the carbon-carbon double bonds originating from the isoprene units or the butadiene units have been hydrogenated.

As far as the polymer block A and the polymer block B are linked to one another, they may be linked in any manner of linking, forming a straight-chained, branched or radial molecule of the addition polymerization-based block copolymer (I). Two or more of these manners of linking may be combined in one molecule. Preferably, the polymer block A and the polymer block B are linked together to form a straight-chained molecule. Examples of the straight-chained molecules include triblock copolymers as denoted by A-B-A, tetrablock copolymers as denoted by A-B-A-B and pentablock copolymers as denoted by A-B-A-B-A, given that "A" represents the polymer block A and "B" represents the polymer block B. Of these, triblock copolymers ("A-B-A") are particularly preferred because of the flexibility and readiness of the production of the addition polymerization-based block copolymer (I).

While the addition polymerization-based copolymer (I) may have any number average molecular weight, it preferably has a number average molecular weight in the range of 30000 to 1000000, and more preferably in the range of 40000 to 300000. The term "number average molecular weight" as used herein refers to a number average molecular weight as determined by gel permeation chromatography (GPC) using polystyrene standards.

The addition polymerization-based copolymer (I) of the present invention can be produced, for example, by a known anionic polymerization technique. Specifically, the alkylstyrene for forming the structural unit (a), or a mixture of the alkylstyrene for forming the structural unit (a) and the aromatic vinyl compound, and the conjugated diene compound are sequentially polymerized to form a block copolymer (i.e., non-hydrogenated form of the addition polymerization-based block copolymer (I)). Using an initiator such as an alkyllithium compound, the reaction is carried out in n-hexane, cyclohexane, or other organic solvents that are inert to the polymerization.

When necessary, the resulting block copolymer is hydrogenated. The hydrogenation reaction is generally carried out in a saturated hydrocarbon solvent such as cyclohexane at a reaction temperature of 20 to 100° C. under a hydrogen pressure of 0.1 to 10 MPa and in the presence of a hydrogenation catalyst, giving a hydrogenated product of the addition polymerization-based block copolymer (I). Examples of such hydrogenation catalysts include Raney nickels; heterogeneous catalysts containing metals, such as Pt, Pd, Ru, Rh, and Ni, carried by carbon, alumina, diatomite, and other suitable carriers; Ziegler catalysts containing an organic metal compound of, for example, cobalt, nickel and other group 9 or group 10 metals, combined with an organoaluminum compound or organolithium compound, such as triethylaluminum and triisobutylaluminum; and metallocene catalysts containing a bis(cyclopentadienyl) compound of transition metals, such as titanium, zirconium, and hafnium, combined with an organic metal compound, such as lithium, sodium, potassium, aluminum, zinc, and magnesium.

While the degree of hydrogenation may be adjusted depending on what physical properties are required of the curable resin composition of the present invention, it is preferred that 70% of more, preferably 85% or more, and more preferably 95% or more of the carbon-carbon double bonds that result from the conjugated diene compound units of the polymer block B for forming the addition polymerization-based block copolymer (I) are hydrogenated when heat resistance, weather resistance, and ozone resistance are particularly important.

The degree of hydrogenation of the carbon-carbon double bonds that result from the conjugated diene compound units of the polymer block B can be determined by measuring the amount of the carbon-carbon double bonds in the polymer block B before the hydrogenation reaction and the amount after the hydrogenation reaction by means of iodimetry, IR spectrophotometry, nuclear magnetic resonance or other suitable techniques and taking the difference between these amounts.

Preferably, the addition polymerization-based block copolymer (I) is present in the curable resin composition of the present invention in an amount of 30 to 99% by mass and, more preferably, in an amount of 50 to 95% by mass. If the amount of the addition polymerization-based block copolymer (I) in the curable resin composition is less than 30% by mass, then the resulting uncured plate (i.e., flexographic plate material yet to be irradiated with an active energy ray), formed of the curable resin composition, will not be hard enough, so that the plate becomes susceptible to cold flow and, thus, deformation during its storage or transportation. Such flexographic plates are less suitable for printing. If the amount is more than 99% by mass, then the resulting curable resin composition becomes excessively hard, making it difficult for the flexographic plate to effectively transfer an ink to cardboards, recycled paper and other paper articles that have rough surfaces.

The ethylenic unsaturated compound (II) for use in the curable resin composition of the present invention may be a carboxylic acid having carbon-carbon double bonds, such as acrylic acid, methacrylic acid, fumaric acid, and maleic acid, or an ester thereof (for example, diethyl fumarate, dibutyl fumarate, dioctyl fumarate, distearyl fumarate, butyloctyl fumarate, diphenyl fumarate, dibenzyl fumarate, dibutyl maleate, dioctyl maleate, bis(3-phenylpropyl) fumarate, dilauryl fumarate, and dibehenyl fumarate); (meth)acrylamide, such as acrylamide, methacrylamide, and diacetone acrylamide; an N-substituted maleimide, such as N-n-hexylmaleimide, N-cyclohexylmaleimide, N-n-octylmaleimide, N-2-ethylhexylmaleimide, N-n-decylmaleimide, and N-n-laurylmaleimide; a di(meth)acrylate, such as ethylene glycol di(meth)acrylate, diethylene glycol di(meth)acrylate, propylene glycol di(meth)acrylate, dipropylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, and 1,9-nonanediol di(meth)acrylate; styrene, vinyl toluene, divinyl benzene, diallyl phthalate, and triallyl cyanulate. These compounds may be used either individually or in combination of two or more compounds.

Preferably, the ethylenic unsaturated compound (II) is present in the curable resin composition of the present invention in an amount of 1 to 70% by mass and, more preferably, in an amount of 5 to 50% by mass. If the amount of the ethylenic unsaturated compound (II) present in the curable resin composition is less than 1% by mass, then the resulting uncured plate (i.e., flexographic plate material yet to be irradiated with an active energy ray) made of the curable resin composition may not cure to a sufficient degree upon irradiation with an active energy ray. As a result, desired sharp image plate surfaces may not be obtained. If the amount is more than 70% by mass, then the curable resin composition, once cured, becomes excessively hard, making it difficult for the flexographic plate to effectively transfer an ink to cardboards, recycled paper, and other paper articles that have rough surfaces.

The photopolymerization initiator (III), an optional component of the curable resin composition of the present invention, may be benzophenone, benzoin, benzoin methyl ether, benzoin ethyl ether, benzoin isopropyl ether, α-methylolbenzoin, α-methylolbenzoin methyl ether, α-methoxybenzoin methyl ether, benzoin phenyl ether, and α-t-butylbenzoin. These compounds may be used either individually or in combination of two or more compounds.

When used, the photopolymerization initiator (III) is added to the curable resin composition of the present invention preferably in an amount of 0.1 to 10% by mass and, more preferably, in an amount of 0.2 to 8% by mass with respect to the total amount of the curable resin composition.

If the amount of the photopolymerization initiator (III) is less than 0.1% by weight, then the curable resin composition does not undergo crosslinking to a sufficient degree, resulting in that it is hard to obtain sufficient curability. In comparison, if contained in amounts larger than 10% by mass, the photopolymerization initiator (III) leads to a reduced transmittance of the curable resin composition to an active energy ray and, thus, a reduced sensitivity to irradiation. As a result, it is hard to form sufficient crosslinking.

The softener (IV) is another optional component of the curable resin composition of the present invention. Examples of such softeners include diene-based liquid rubbers, such as liquid polyisoprene, liquid 1,2-polybutadiene, liquid 1,4-polybutadiene, liquid poly 1,2-pentadiene, liquid ethylene-butadiene copolymer, liquid acrylonitrile-butadiene copolymer, and modified products and hydrogenated products thereof; petroleum-based softeners, such as paraffin-, naphthene-, and aromatic compound-based processed oils; liquid paraffin; and vegetable oil-based softeners, such as peanut oil and rosin. These softeners may be used either individually or as a mixture of two or more softeners. Of these, diene-based liquid rubber is particularly preferred for use in the present invention.

When used, the softener (IV) may be added in any amount that does not affect the objective of the present invention. The softener, however, is preferably added in an amount of 5 to 50% by mass with respect to the total amount of the curable resin composition.

As far as the objective of the present invention is not interfered, the following polymers may further be added to the curable resin composition of the present invention: rubbers, such as natural rubbers, synthetic polyisoprene rubber, polybutadiene rubber, styrene-butadiene rubber, chloroprene rubber, ethylene-propylene rubber, acryl rubber, butyl rubber, and acrylonitrile-butadiene rubber; and styrene-based block copolymers, such as polystyrene-polyisoprene-polystyrene block copolymers, polystyrene-polybutadiene-polystyrene block copolymers, and hydrogenated products thereof. These polymers may be used either individually or in combination of two or more polymers.

If necessary, various auxiliary additives used in common photosensitive resin compositions may be added to the curable resin composition of the present invention, including heat polymerization inhibitors, such as 2,6-di-t-butyl-p-cresol, p-methoxyphenol, pentaerythritol tetrakis[3-(3',5'-di-t-butyl-4'-hydroxy)phenylpropionate], hydroquinone, t-butyl catechol, t-butyl hydroxyanisole, and 4,4'-butylidene bis(3-methyl-6-t-butyl)phenol; UV absorbents; antihalation agents; and photostabilizers. These compounds may be used either individually or in combination of two or more.

The curable resin composition of the present invention can be produced by mixing/kneading the above-described addition polymerization-based block copolymer (I), the ethylenic unsaturated compound (II), and, if necessary, the photopolymerization initiator (III), the softener (IV), and the other optional additives on, for example, a kneader.

The active energy ray that is used to cure the curable resin composition of the present invention may be a particle beam, electromagnetic wave, or a combination of these. Examples of the particle beam include electron beam (EB) and α-ray, and examples of the electromagnetic wave include ultraviolet ray (UV), visible light, infrared ray, γ-ray, and X-ray. Of these, electron beam (EB) and ultraviolet ray (UV) are particularly preferred. These active energy rays can be irradiated using known apparatuses. The electron beam may be accelerated at a voltage of 0.1 to 10 MeV and irradiated at a dose of 1 to 500 kGy. A lamp with an irradiation wavelength of 200 to 450 nm may be preferably used as the source of ultraviolet ray (UV). Examples of the electron beam (EB) source include tungsten filament, and examples of the ultraviolet ray (UV) source include low-pressure mercury-vapor lamp, high-pressure mercury-vapor lamp, ultraviolet mercury lamp, carbon arc lamp, xenon lamp, and zirconium lamp.

The curable resin composition of the present invention is particularly suitable for use as a constituent of flexographic plates. Specifically, the use of the curable resin composition of the present invention as a constituent can allow production of flexographic plates that undergo minimum deformation (cold flow) during storage or transportation of uncured plates (i.e., flexographic plate material yet to be irradiated with the active energy ray), are ideal for printing sharp images, and that can ensure high quality printing in printing on cardboards, recycled paper, and other poor quality paper articles having rough surfaces by being capable of effectively transferring an ink onto such paper articles.

A preferred technique for producing a flexographic plate material that uses the curable resin composition of the present invention as a constituent involves molding the molten curable resin composition of the present invention into a desired shape by using press molding, extrusion molding, or calendering. The composition is molded such that it is deposited on a substrate to a thickness of approximately 200 μm to 20 mm. The substrate may be a plastic sheet, rubber sheet, foamed olefin sheet, foamed rubber sheet, foamed urethane sheet, or metal sheet. If necessary, an adhesive may be used to adhere the substrate to the curable resin composition of the present invention. Also, if necessary, a protective film, such as a polyethylene terephthalate film, may be applied to the surface of the curable resin composition so as to keep the curable resin composition of the present invention from being affected by oxygen present in the atmosphere.

One exemplary technique for obtaining a flexographic plate from the flexographic plate material using the curable resin composition of the present invention as a constituent includes the following procedures: First, the surface protective film, if any, is removed. A film carrying a negative image of a letter, diagram, picture, pattern or any other image to be printed is then applied to the layer of the curable resin composition of the present invention. The negative film is irradiated with an active energy ray from above, so that the predetermined area of the curable resin composition layer is selectively cured by the action of the active energy ray transmitted through the imaged area of the negative film and become insoluble to solvent. Subsequently, the negative film is removed and a solvent is applied to remove the non-irradiated or uncured area of the curable resin composition layer and thereby form an image area.

Examples of the solvents that can be used to remove the uncured area include tetrachloroethylene, aromatic hydrocarbons, such as, toluene and xylene, acetates, limonene, and decahydronaphthalene, as well as mixtures of these solvents with n-butanol, 1-pentanol, and benzyl alcohol. The unexposed area (i.e., uncured area of the curable resin composition) may be dissolved away, for example, by applying the solvent sprayed from a nozzle or by washing with the solvent and a brush.

The flexographic plate material obtained by using the curable resin composition of the present invention as a constituent undergoes minimum deformation during storage or transportation of uncured plates (i.e., flexographic plate material yet to be irradiated with the active energy ray). The flexographic plate material of the present invention can form a sharp image plate surface by irradiating with the active energy ray, and can ensure high quality printing in printing on cardboards, recycled paper, and other poor quality paper articles with rough surfaces by being capable of effectively transferring an ink onto such paper articles.

The present invention thus provides a curable resin composition suitable for the production of a flexographic plate material that allows printing on an article with rough surfaces, such as cardboard and recycled paper. The curable composition of the present invention can be cured to form strong and extendable areas and can thus be used to make flexographic plates that can form a sharp image plate surface even for a fine image. The present invention also provides a flexographic plate material that uses the curable resin composition as its constituent.

The present invention will now be described in further detail with reference to Examples, which are not intended to limit the scope of the invention in any way. In each of Examples and Comparative Examples described below, an exemplary curable resin composition was evaluated for different physical properties. The evaluation was made according to the following methods.

(1) The Shape Stability of Uncured Plate Prior to Irradiation with Active Energy Ray A 2 mm-thick sheet made of each of the curable resin compositions obtained in Examples and Comparative Examples was cut into a 5 cm long×5 cm wide sample piece. While a 30 g/cm$^2$ load was applied to the entire surface of the sample piece, the sample piece was left in a 40° C. atmosphere for 24 hours. Subsequently, the thickness of the sample piece was measured and the sample was determined to be "acceptable" if the decrease in thickness was less than 2% (indicated by a circle) and "not acceptable" if the decrease in thickness was 2% or more (indicated by a cross).

(2) The Tensile Strength at Break and Elongation at Break After Curing

A 2 mm-thick sheet made of each of the curable resin compositions obtained in Examples and Comparative Examples was entirely irradiated with a UV ray at 30 mW/cm$^2$ (radiation wavelength=200-450 nm) for 1 minute. Following this, a No. 5 dumbbell-shaped sample piece as specified by JIS K 6251 was made out of the sheet and was stretched on an INSTRON universal tester at a rate of 500 mm/min at 23° C. to determine the tensile strength at break (MPa) and the elongation at break (%).

(3) Reproducibility of Negative Image

A 15 cm×15 cm sample piece was cut out from a 2 mm-thick pressed sheet made of each of the curable resin compositions obtained in Examples and Comparative Examples. A film carrying a negative image was applied to the sample piece, and a UV ray was irradiated onto the film at 30 mW/cm$^2$ (radiation wavelength=200-450 nm) for 1 minute. The negative film was then removed and the uncured area (unexposed area) was dissolved by toluene and was scraped off with the help of a brush. Subsequently, the sample piece was dried at 60° C. for 30 minutes and was then irradiated with a UV ray at 30 mW/cm$^2$ (radiation wavelength=200-450 nm) for 10 minutes. Using a light microscope at 50× magnification, the resulting plate was observed for how well the thin lines forming projected areas are reproduced and recessed areas are carved. The sample was determined to be "acceptable" if the negative image was precisely reproduced without cracking or chipping of the image (indicated by "G") and "non-acceptable" if the reproduction was insufficient (indicated by "NG").

POLYMERIZATION EXAMPLE 1

50 kg of cyclohexane and 265 ml of a cyclohexane solution of sec-butyllithium (11% by mass) were placed in a pressure vessel equipped with a stirrer. To this solution, 2.25 kg of p-methylstyrene were added over a 30-minute period and the polymerization was allowed to proceed at 50° C. for 120 minutes. Following the addition of 80 g of tetrahydrofuran, 10.5 kg of butadiene were added over a 60-minute period and the polymerization was allowed to proceed at 50° C. for 30 minutes. Additional 2.25 kg of p-methylstyrene were added over a 30-minute period and the polymerization was allowed to proceed at 50° C. for 30 minutes. This gave a reaction mixture containing a poly(p-methylstyrene)-polybutadiene-poly(p-methylstyrene) triblock copolymer (which is referred to as "block copolymer (I)-1," hereinafter). The resulting block copolymer (I)-1 had a number average molecular weight of 76400, and the amount of p-methylstyrene as determined by $^1$H-NMR was 30% by mass. It was determined that 40 mol % of the butadiene units forming the polybutadiene block were linked by 1,2-linkage.

To the resulting reaction mixture containing the block copolymer (I)-1, a hydrogenation catalyst, separately prepared by adding 400 g of triisopropylaluminum (20% by mass, cyclohexane solution) to 130 g of nickel octanoate (64% by mass, cyclohexane solution), was added, and the hydrogenation reaction was allowed to proceed at 80° C. in a hydrogen atmosphere of 1 MPa. This gave a hydrogenated product of the poly p-methylstyrene-polybutadiene-poly p-methylstyrene triblock copolymer (The product is referred to as "block copolymer (I)-2," hereinafter). The resulting block copolymer (I)-2 had a number average molecular weight of 77000, and the amount of p-methylstyrene and the degree of hydrogenation as determined by $^1$H-NMR were 29% by mass and 97%, respectively.

POLYMERIZATION EXAMPLE 2

50 kg of cyclohexane and 130 ml of a cyclohexane solution of sec-butyllithium (11% by mass) were placed in a pressure vessel equipped with a stirrer. To this solution, 1.57 kg of p-methylstyrene were added over a 30-minute period and the polymerization was allowed to proceed at 50° C. for 120 minutes. Following the addition of 120 g tetrahydrofuran, 12.2 kg of isoprene were added over a 60-minute period and the polymerization was allowed to proceed at 50° C. for 30 minutes. Additional 1.57 kg of p-methylstyrene were added over a 30-minute period and the polymerization was allowed to proceed at 50° C. for 30 minutes. This gave a reaction mixture containing a poly(p-methylstyrene)-polyisoprene-poly(p-methylstyrene) triblock copolymer (which is referred to as "block copolymer (I)-3," hereinafter). The resulting block copolymer (I)-3 had a number average molecular weight of 127000, and the amount of p-methylstyrene as determined by $^1$H-NMR was 20% by mass. It was determined that 40 mol % of the isoprene units forming the isoprene block were linked by 1,2-linkage or 3,4-linkage.

POLYMERIZATION EXAMPLE 3

50 kg of cyclohexane and 265 ml of a cyclohexane solution of sec-butyllithium (11% by mass) were placed in a pressure vessel equipped with a stirrer. To this solution, 2.25 kg of styrene were added over a 30-minute period and the polymerization was allowed to proceed at 50° C. for 120 minutes. Following the addition of 80 g tetrahydrofuran, 10.5 kg of butadiene were added over a 60-minute period and the polymerization was allowed to proceed at 50° C. for 30 minutes. Additional 2.25 kg of styrene were added over a 30-minute period and the polymerization was allowed to proceed at 50° C. for 30 minutes. This gave a reaction mixture containing a polystyrene-polybutadiene-polystyrene triblock copolymer (which is referred to as "block copolymer 1" hereinafter). The resulting block copolymer 1 had a number average molecular weight of 76400, and the amount of styrene as determined by $^1$H-NMR was 30% by mass. It was determined that 40 mol % of the butadiene units forming the polybutadiene block were linked by 1,2-linkage.

To the resulting reaction mixture containing the block copolymer 1, a hydrogenation catalyst, separately prepared by adding 400 g of triisopropylaluminum (20% by mass, cyclohexane solution) to 130 g of nickel octanoate (64% by mass, cyclohexane solution), was added, and the hydrogenation reaction was allowed to proceed at 80° C. in a hydrogen atmosphere of 1 MPa. This gave a hydrogenated product of the polystyrene-polybutadiene-polystyrene triblock copolymer (The product is referred to as "block copolymer 2," hereinafter). The resulting block copolymer 2 had a number average molecular weight of 77000, and the amount of styrene and the degree of hydrogenation as determined by $^1$H-NMR were 29% by mass and 97%, respectively.

POLYMERIZATION EXAMPLE 4

50 kg of cyclohexane and 130 ml of a cyclohexane solution of sec-butyllithium (11% by mass) were placed in a pressure vessel equipped with a stirrer. To this solution, 1.57 kg of styrene were added over a 30-minute period and the polymerization was allowed to proceed at 50° C. for 30 minutes. Following the addition of 120 g tetrahydrofuran, 12.2 kg of isoprene were added over a 60-minute period and the polymerization was allowed to proceed at 50° C. for 30 minutes. Additional 1.57 kg of styrene were added over a 30-minute period and the polymerization was allowed to proceed at 50° C. for 30 minutes. This gave a reaction mixture containing a polystyrene-polyisoprene-polystyrene triblock copolymer (which is referred to as "block copolymer 3" hereinafter). The resulting block copolymer 3 had a number average molecular weight of 127000, and the amount of styrene as determined by $^1$H-NMR was 20% by mass. It was determined that 40 mol % of the isoprene units forming the polyisoprene block were linked by 1,2-linkage or 3,4-linkage.

EXAMPLES 1 THROUGH 3

(1) The block copolymer (I)-2 or the block copolymer (I)-3, 1,9-nonanediol diacrylate, benzophenone, and 2,6-di-t-butyl-p-cresol to serve as a heat polymerization inhibitor were mixed together in the corresponding proportion (in % by mass) shown in Table 1 below. The components were kneaded on a kneader at 180° C. for 3 minutes and the resulting curable resin composition was pressed by use of a pressing machine heated to 180° C. under a pressure of 10 MPa for 3 minutes, to make a 2 mm-thick sheet.

(2) The sheet obtained in (1) above was evaluated for the shape stability in the manner described above. The results are shown in Table 1 below.

(3) The sheet obtained in (1) above was irradiated with a UV ray at 30 mW/cm$^2$ for 1 minute and was evaluated for the tensile strength at break and elongation at break in the manner described above. The results are shown in Table 1 below.

(4) A 15 cm×15 cm sample piece was made out of the sheet obtained in (1) above. A film carrying a negative image was applied to one surface of the sample piece and a UV ray was irradiated from above the negative film at 30 mW/cm². The sample piece was entirely irradiated for 1 minute. The reproducibility of the negative image then was evaluated in the manner described above. The results are shown in Table 1 below.

Comparative Examples 1 Through 3

In each of Comparative Examples 1 through 3, a sheet was prepared in the same manner as in Examples 1 through 3, except that the block copolymer 2 or the block copolymer 3 was used in place of the block copolymer (I)-2 or the block copolymer (I)-3. The sheet was similarly evaluated for the shape stability of uncured plate, the tensile strength at break, the elongation at break, and the reproducibility of negative image. The results are shown in Table 1 below.

TABLE 1

|  | Ex. 1 | Ex. 2 | Ex. 3 | Comp. Ex. 1 | Comp. Ex. 2 | Comp. Ex. 3 |
|---|---|---|---|---|---|---|
| Proportion (% mass) | | | | | | |
| Block copolymer (I)-2 | 86 | | | | | |
| Block copolymer (I)-3 | | 86 | 71 | | | |
| Block copolymer 2 | | | | 86 | | |
| Block copolymer 3 | | | | | 86 | 71 |
| 1,9-nonanediol diacrylate | 10 | 10 | 25 | 10 | 10 | 25 |
| Benzophenone | 3 | 3 | 3 | 3 | 3 | 3 |
| 2,6-di-t-butyl cresol | 1 | 1 | 1 | 1 | 1 | 1 |
| tensile strength at break (MPa) | 10 | 12 | 8.6 | 6.8 | 7.2 | 5.8 |
| elongation at break (%) | 440 | 480 | 320 | 220 | 260 | 210 |
| Shape stability of uncured plate | G | G | G | G | NG | NG |
| Reproducibility of negative image | G | G | G | NG | G | G |

A comparison between Examples 1 through 3 and respective Comparative Examples 1 through 3 indicates that each of the sheets obtained by irradiating respective sheets of the curable resin compositions of the present invention shows a superior tensile strength at break and an improved elongation at break. This suggests that when used as a material of a flexographic plate, these compositions are each expected to improve the tensile strength at break and elongation at break of the cured area of the plate. In addition, the sheets made of the curable resin compositions of Examples 1 through 3 exhibit a better shape stability of uncured plate as compared to those of respective Comparative Examples 1 through 3. This indicates that each of the sheets made of the curable resin compositions of the present invention is expected to offer an improved reproducibility of negative images when actually used in the production of flexographic plates (i.e., application of negative film, followed by irradiation with a UV ray, followed by removal of uncured area).

EXAMPLES 4 THROUGH 6

(1) The block copolymer (I)-1, the block copolymer (I)-2, or the block copolymer (I)-3, a liquid polybutadiene NISSO-PB C-1000 [Nippon Soda Co., Ltd., α,ω-polybutadiene dicarboxylic acid, number average molecular weight=1200-1550, viscosity=10-30 Pa·s (100-300 poise; 45° C.)], 1,9-nonanediol diacrylate, benzophenone, and 2,6-di-t-butyl-p-cresol - to serve as a heat polymerization inhibitor were mixed together in the corresponding proportion shown in Table 1. The components were kneaded on a kneader at 150° C. for 3 minutes and the resulting curable resin composition was pressed on a press heated to 150° C. under a pressure of 10 MPa for 3 minutes, to make a 2 mm-thick sheet.

(2) The sheet obtained in (1) above was evaluated for the shape stability in the manner described above. The results are shown in Table 2 below.

(3) The sheet obtained in (1) above was irradiated with a UV ray at 30 mW/cm² for 1 minute and was evaluated for the tensile strength at break and elongation at break in the manner described above. The results are shown in Table 2 below.

(4) A 15 cm long×15 cm wide sample piece was made out of the sheet obtained in (1) above. A film carrying a negative image was applied to one surface of the sample piece and a UV ray was irradiated from above the negative film at 30 mW/cm². The sample piece was entirely irradiated for 1 minute. The reproducibility of the negative image then was evaluated in the manner described above. The results are shown in Table 2 below.

Comparative Examples 4 Through 6

In each of Comparative Examples 4 through 6, a sheet was prepared in the same manner as in Examples 4 through 6, except that the block copolymer 1, the block copolymer 2, or the block copolymer 3 was used in place of the block copolymer (I)-1, the block copolymer (I)-2, or the block copolymer (I)-3. The sheet was similarly evaluated for the shape stability of uncured plate, the tensile strength at break, the elongation at break, and the reproducibility of negative image. The results are shown in Table 2 below.

TABLE 2

|  | Ex. 4 | Ex. 5 | Ex. 6 | Comp. Ex. 4 | Comp. Ex. 5 | Comp. Ex. 6 |
|---|---|---|---|---|---|---|
| Proportion (% mass) | | | | | | |
| Block copolymer (I)-1 | 60 | | | | | |
| Block copolymer (I)-2 | | 60 | | | | |
| Block copolymer (I)-3 | | | 60 | | | |
| Block copolymer 1 | | | | 60 | | |
| Block copolymer 2 | | | | | 60 | |
| Block copolymer 3 | | | | | | 60 |
| Liquid polybutadiene (NISSO-PB C-1000) | 33 | 33 | 33 | 33 | 33 | 33 |
| 1,9-nonanediol diacrylate | 5 | 5 | 5 | 5 | 5 | 5 |
| Benzophenone | 1.5 | 1.5 | 1.5 | 1.5 | 1.5 | 1.5 |
| 2,6-di-t-butyl cresol | 0.5 | 0.5 | 0.5 | 0.5 | 0.5 | 0.5 |
| tensile strength at break (MPa) | 8.1 | 7.0 | 7.2 | 4.8 | 4.2 | 4.3 |
| elongation at break (%) | 300 | 380 | 420 | 200 | 210 | 220 |
| Shape stability of uncured plate | G | G | G | NG | G | NG |
| Reproducibility of negative image | G | G | G | NG | NG | G |

A comparison between Examples 4 through 6 and respective Comparative Examples 4 through 6 indicates that each of the sheets obtained by irradiating respective sheets of the curable resin compositions of the present invention shows a superior tensile strength at break and an improved elongation at break. This suggests that when used as a material of a flexographic plate, these compositions are each expected to improve the tensile strength at break and elongation at break of the cured area of the plate. In addition, the sheets made of the curable resin compositions of Examples 4 through 6 exhibit a better shape stability of uncured plate as compared to those of respective Comparative Examples 4 through 6.

This indicates that each of the sheets made of the curable resin compositions of the present invention is expected to offer an improved reproducibility of negative images when actually used in the production of flexographic plates (i.e., application of negative film, followed by irradiation with a UV ray, followed by removal of uncured area).

INDUSTRIAL APPLICABILITY

As set forth, the flexographic plate material using the curable resin composition of the present invention as its constituent can be cured to form strong and extendable areas and can be used to make flexographic plates that can form a sharp image plate surface even for a fine image. The flexographic plate material of the present invention is particularly useful in printing on cardboards, recycled paper or other paper articles with rough surfaces.

In addition, the flexographic plate material of the present invention allows production of flexographic plates that undergo minimum deformation during storage or transportation of uncured plates (i.e., flexographic plate material yet to be irradiated with the active energy ray), can form a sharp image plate surface by irradiating with the active energy ray, and can ensure high quality printing in printing on cardboards, recycled paper and other poor quality paper articles having rough surfaces by being capable of effectively transferring an ink onto such paper articles.

The invention claimed is:

1. A cured material, obtained by irradiating a curable resin composition with an active energy ray so that a moiety of a polymer block A contained in the curable resin composition is crosslinked, the curable resin comprising an addition polymerization-based block copolymer (I), an ethylenic unsaturated compound (II), and a photopolymerization initiator (III), wherein:

the addition polymerization-based block copolymer (I) is selected from block copolymers comprising at least one polymer block A and at least one polymer block B, and the hydrogenated products thereof;

the polymer block A comprises an aromatic vinyl compound unit containing at least 10% by mass of an alkylstyrene-derived structural unit (a) in which at least one alkyl group having 1 to 8 carbon atoms is bound to a benzene ring; and the polymer block B comprises a conjugated diene compound unit.

2. The cured material composition according to claim 1, further comprising a softener (IV).

3. The cured material composition according to claim 1, wherein the structural unit (a) in which at least one alkyl group having 1 to 8 carbon atoms is bound to a benzene ring is a p-methylstyrene unit.

4. A flexographic plate material, comprising the cured material according to claim 1 as a constituent.

5. The cured material composition according to claim 1, wherein the structural unit (a) in which at least one alkyl group having 1 to 8 carbon atoms is bound to a benzene ring is a p-ethylstyrene unit.

* * * * *